(12) United States Patent
Lee et al.

(10) Patent No.: US 6,278,618 B1
(45) Date of Patent: Aug. 21, 2001

(54) SUBSTRATE STRIPS FOR USE IN INTEGRATED CIRCUIT PACKAGING

(75) Inventors: Shaw Wei Lee, Cupertino; Anindya Poddar, Sunnyvale, both of CA (US); Ram Veeraraghavan, Singapore (SG); Thanh Lequang, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/416,276

(22) Filed: Oct. 14, 1999

Related U.S. Application Data

(60) Provisional application No. 60/145,480, filed on Jul. 23, 1999.

(51) Int. Cl.[7] .............................. H01R 23/68; H05K 3/10; H05K 3/02; H01L 21/66
(52) U.S. Cl. ............................ 361/820; 438/17; 438/111; 361/823; 29/847
(58) Field of Search ................................. 438/15, 17, 14, 438/106, 110, 111, 112, 113, 125, 126, 127, 128, 130; 361/679, 728, 729, 746, 823, 500, 820; 29/592.1, 825, 829, 846, 847

(56) References Cited

U.S. PATENT DOCUMENTS

Re. 36,773 * 7/2000 Nomi et al. .
5,990,547 * 11/1999 Sharma et al. .
6,043,559 * 3/2000 Banerjee et al. .

* cited by examiner

Primary Examiner—Tuan H. Nguyen
Assistant Examiner—Evan Pert
(74) Attorney, Agent, or Firm—Beyer Weaver & Thomas, LLP

(57) ABSTRACT

A variety of improved substrate structures and substrate fabrication techniques for use in integrated circuit packaging are described. In one aspect, a substrate strip fabrication technique that facilitates strip testing of the dice mounted thereon is described. The described technique works well even when landings on the substrate are electrolytically plated. In a preferred embodiment, the substrate is formed in a manner that facilitates the use of non-stick detection during wire bonding. In a distinct aspect of the invention the substrate strip has a plurality of distinct molding area tiles that each have a two dimensional array of substrate segments formed thereon. The substrate segments each have a die attach area, a plurality of landing one surface and a plurality of contact pads on the other. The contact pads are positioned substantially across from the landings and are electrically connected thereto by associated vias. The landings have bond pads suitable for use in wire bonding and are preferably arranged in at least one row that extends adjacent or around the die attach area. The contact pads are positioned opposite the landings. With this arrangement, extended routing traces are not required to electrically couple the bond pads to the contact pads.

19 Claims, 10 Drawing Sheets

SUBSTRATE STRIPS FOR USE IN INTEGRATED CIRCUIT PACKAGING

This appln claims the benefit of provisional No. 60/145,480 filed Jul. 23, 1999.

BACKGROUND OF THE INVENTION

The present invention relates generally to packaging for integrated circuit devices. More particularly, it relates to forming substrates that facilitate testing integrated circuits mounted thereon in strip or panel form.

In the semiconductor industry, there are ongoing efforts to provide smaller, less expensive and faster integrated circuit devices. One aspect of these efforts is directed at the development of more efficient packaging structures, arrangements and processes. One common packaging arrangement is known as grid array based packaging (e.g., ball grid arrays, pin grid arrays, etc.). In a grid array type package, a die is typically mounted on the top surface of a substrate that has an array of contacts on its bottom surface. The die is then electrically connected to landings on the top surface of the substrate. The substrate provides electrical routing and connectivity between the landings on the top surface of the substrate and the contacts on the bottom surface.

Typically, during packaging, substrate strips or panels are provided that have a plurality of distinct molding areas. For lack of the availability of a common term, the molding areas are referred to as tiles herein. The tiles are typically (although not always) separated by thermal expansion slots. A representative substrate strip 101 is illustrated in FIG. 1. Traditionally, a single die was mounted in a die attach area 103 near the center of each tile 102. The die is then electrically coupled to landings 105 on the top surface of the tile 102. The die may be electrically coupled to the landings by a variety of traditional techniques, although wire bonding is most common. The landings 105 are coupled to associated vias 107 by traces 109 on the top surface of tile 102. The vias 107 are electrically conductive and pass through substrate. The vias are then typically coupled to associated contacts (not shown) on the bottom surface of the substrate by traces (not shown) on the bottom surface of the substrate.

After the dice on a particular strip have all been mounted and electrically connected, a plastic cap is typically formed over each die. The packaged integrated circuits are then typically trimmed (i.e. the excess portions of the strip are trimmed away thereby separating the packed integrated circuits from one another). Thereafter, the packaged integrated circuits are typically tested.

As die and package sizes have been reduced, there have been recent efforts to mount a plurality of dice within each tile (molding area) with the intention and result of forming several distinct integrated circuit packages on each substrate tile. Although this approach has many advantages, due to the nature of the way that the substrate strips are formed, the packages cannot be tested in the strip form. Rather, the packaged devices are singulated and then tested in the singulated form.

Although the existing substrate arrangements and individual testing have worked well in the past, as smaller and higher density packaging becomes more common, improved substrate strip structures and improved testing techniques that are less expensive and have less problems than the current structures and techniques will become necessary and desirable.

SUMMARY OF THE INVENTION

To achieve the forgoing and other objects and in accordance with the purpose of the invention, a variety of improved substrate structures and substrate fabrication techniques are described. In one aspect, a substrate strip fabrication technique that facilitates strip testing of the dice mounted thereon is described. In one aspect a substrate strip having a plurality of vias and metalization that defines a plurality of landings located on a top surface and a plurality of contact pads on a bottom surface is formed. The patterning also defines buss lines and/or interconnection features which electrically couple various landings. Portions of the landings (which by way of example may be formed from copper) are plated with one or more further metallic layers (such as gold or gold in combination with a barrier layer). The landings are electrically charged or grounded during at least a portion of the plating of these further metallic layers to facilitate the plating (as for example is required in electrolytic plating). The electrical connections between a most of the bond fingers are severed after the further metallic layer plating by removing at least a portion of the buss lines and/or interconnection features, without separating the substrate segments. In a preferred embodiment, the electrical connections between the bond fingers are provided to facilitate the plating of the further metallic layers. The connections are severed to permit strip testing of dice that are eventually mounted on the substrate. In some embodiments, some of the electrical connections are retained to permit non-stick detection during wire bonding.

In another aspect of the invention, a method of packaging integrated circuits is described that is suitable for facilitating strip testing of a large number of integrated circuits that are mounted on the strip. In this aspect a plurality of dice are mounted on a substrate strip that has a plurality of molding areas. Each molding area includes an array of substrate segments (e.g. a two dimensional array of substrate segments). Each substrate segment has a die attach area and a plurality of landings located on a top surface and a plurality of contact pads on a bottom surface. The dice are electrically connected to the substrate by a suitable technique such as wire bonding. The dice are then encapsulated and electrically tested in strip format. In some embodiments, non-stick detection wiring bonding is used.

In yet another (quite distinct) aspect of the invention, a substrate strip for use in integrated circuit packaging is described. The substrate strip has a plurality of distinct molding area tiles that each have a two dimensional array of substrate segments formed thereon. The substrate segments each have a die attach area, a plurality of landing one surface and a plurality of contact pads on the other. The contact pads are positioned substantially across from the landings and are electrically connected thereto by associated vias. The landings have bond pads suitable for use in wire bonding and are preferably arranged in at least one row that extends adjacent or around the die attach area. The contact pads are positioned opposite the landings. With this arrangement, extended routing traces are not required to electrically couple the bond pads to the contact pads.

In some embodiments, the landings/contacts are arranged in one or more rows about the die attach area. multiple rows of landings/contacts are provided. When desired, the substrate strips can be fabricated in panels that have a plurality of the described strips.

BRIEF DESCRIPTION OF THE DRAWINGS

The invention, together with further objects and advantages thereof, may best be understood by reference to the following description taken in conjunction with the accompanying drawings in which.

DETAILED DESCRIPTION OF THE DRAWINGS

Figure 1:
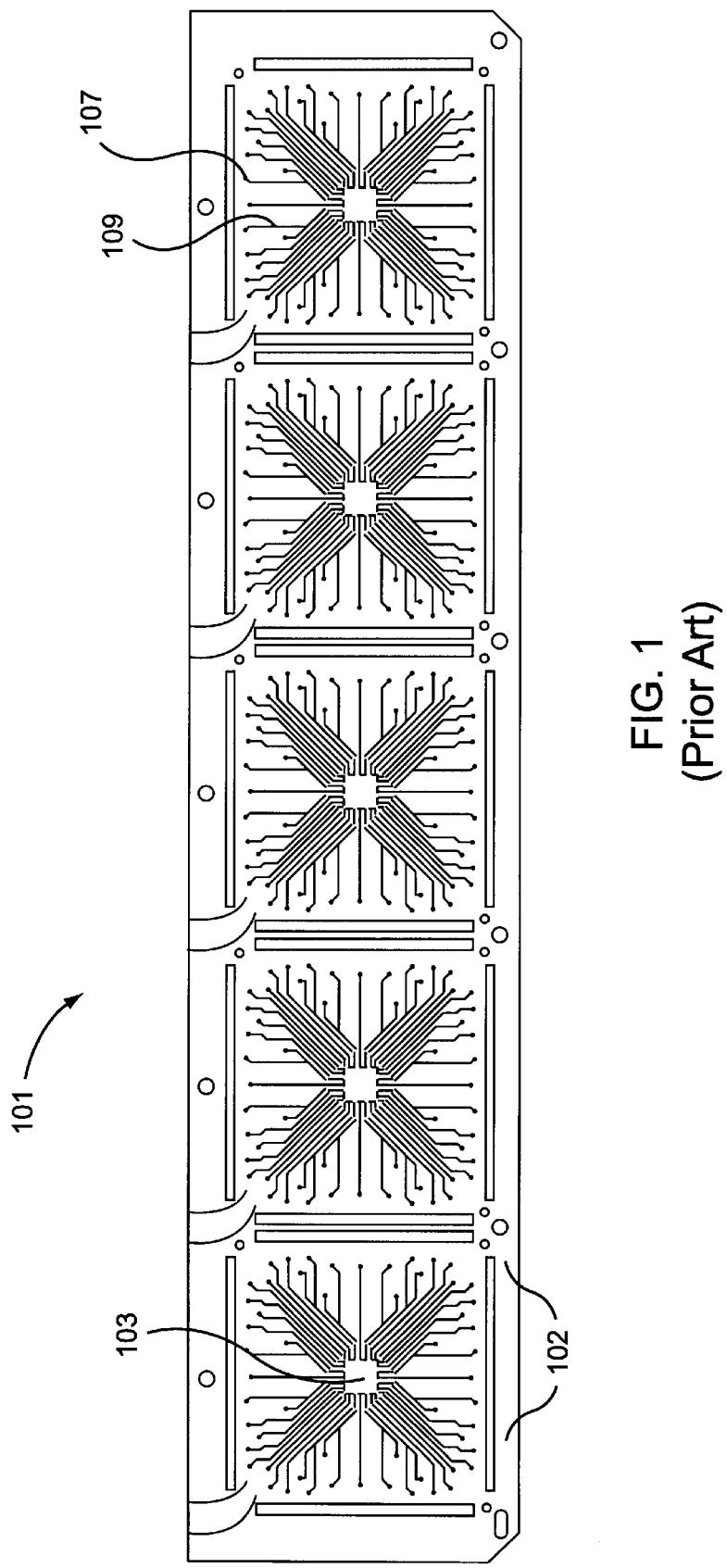
FIG. 1 is a diagrammatic top view of a conventional substrate strip suitable for use in grid array style packaging.
Figure 2:
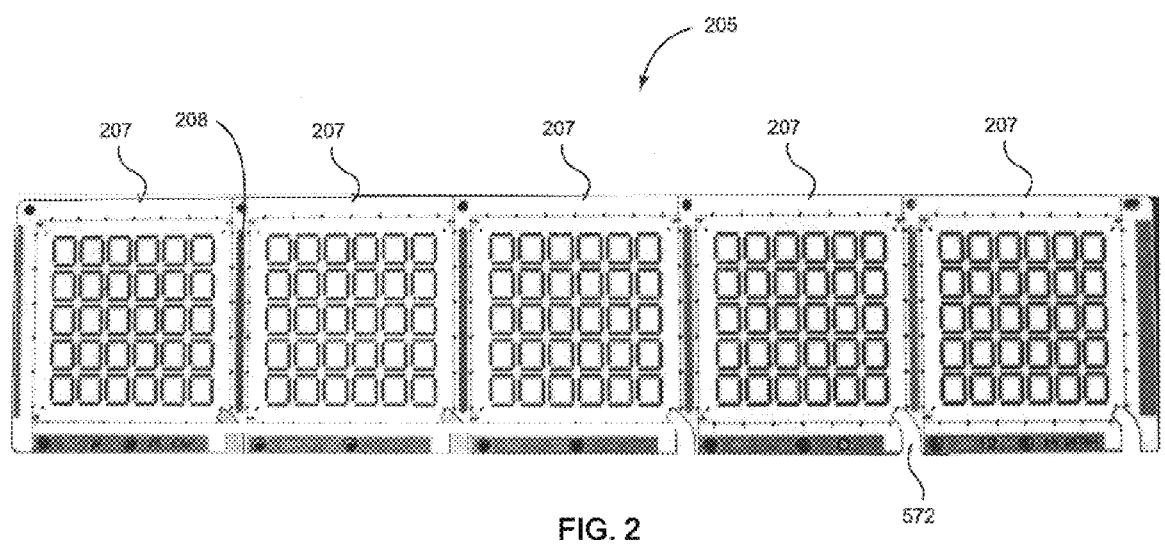
FIG. 2 is a diagrammatic top view of a substrate strip suitable for use in grid array style packaging in accordance with one embodiment of the present invention.

FIG. 2 illustrates a substrate strip formed in accordance with one embodiment of the present invention. As will be appreciated by those skilled in the art, the substrate strips are typically formed in large panels (not shown) having a plurality of substrate strips 205 formed thereon. As seen in FIG. 2, each substrate strip 205 has a plurality of molding areas (tiles) 207. In the embodiment shown, the molding areas are separated by thermal expansion slots 208, although the thermal expansion slots are not always necessary. Each molding area (tile) 207 has a multiplicity of substrate segments 210 formed thereon. Typically, the substrate segments 210 will be arranged in a two dimensional array as illustrated, however it should be appreciated that the layout of the substrate segments may be widely varied. The substrate segments 210 are designed to serve as the substrate for a separate integrated circuit (although they could alternatively be arranged as the substrate for a multi-chip package). The number of substrate segments in each tile may be widely varied based on the needs of a particular application. By way of example, in a substrate strip having 3 by 3 cm tiles, on the order of 2–20 rows and 2–20 columns of substrate segments may be appropriate for most applications. In the embodiment shown, a five by five array of substrate segments is shown.

Figure 3A:
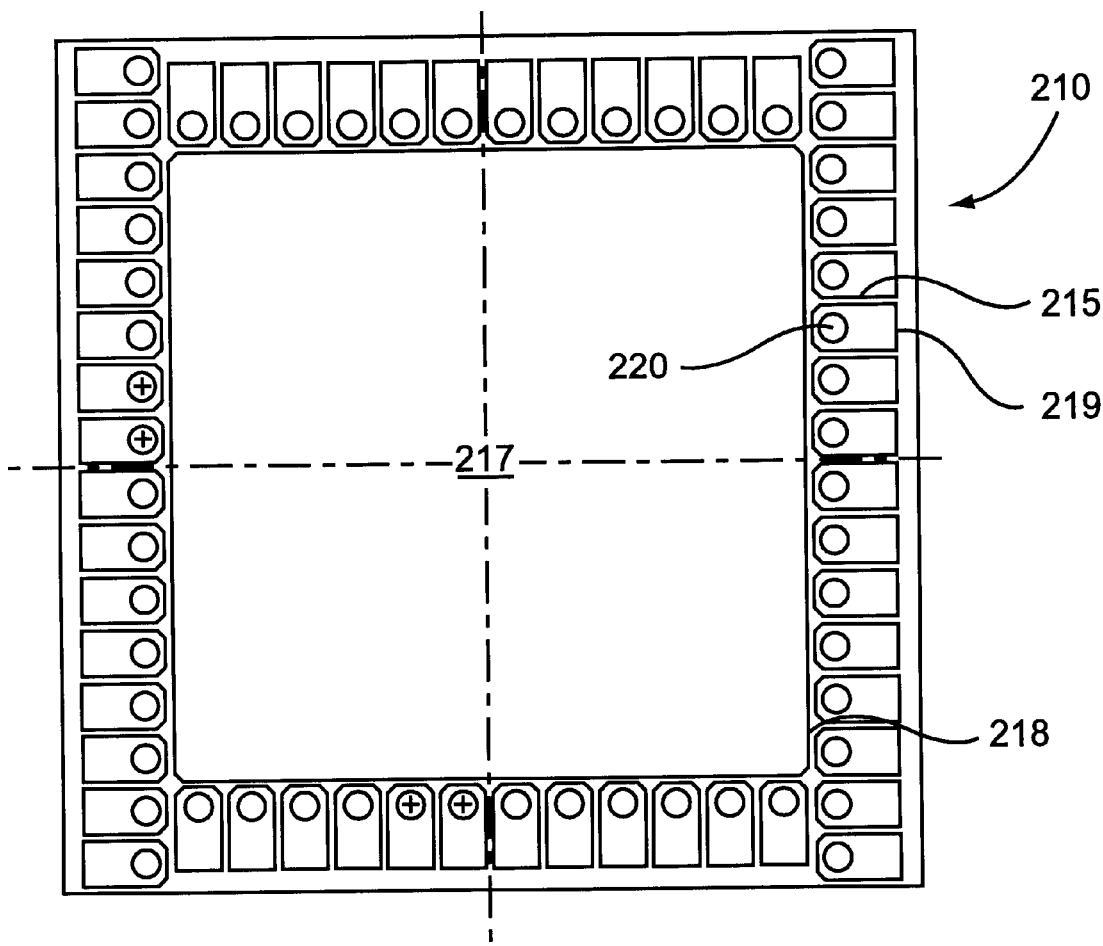
FIG. 3(a) is a diagrammatic top view of a substrate segment from a tile in the substrate strip of FIG. 2 having a single row of contacts.
Figure 3B:
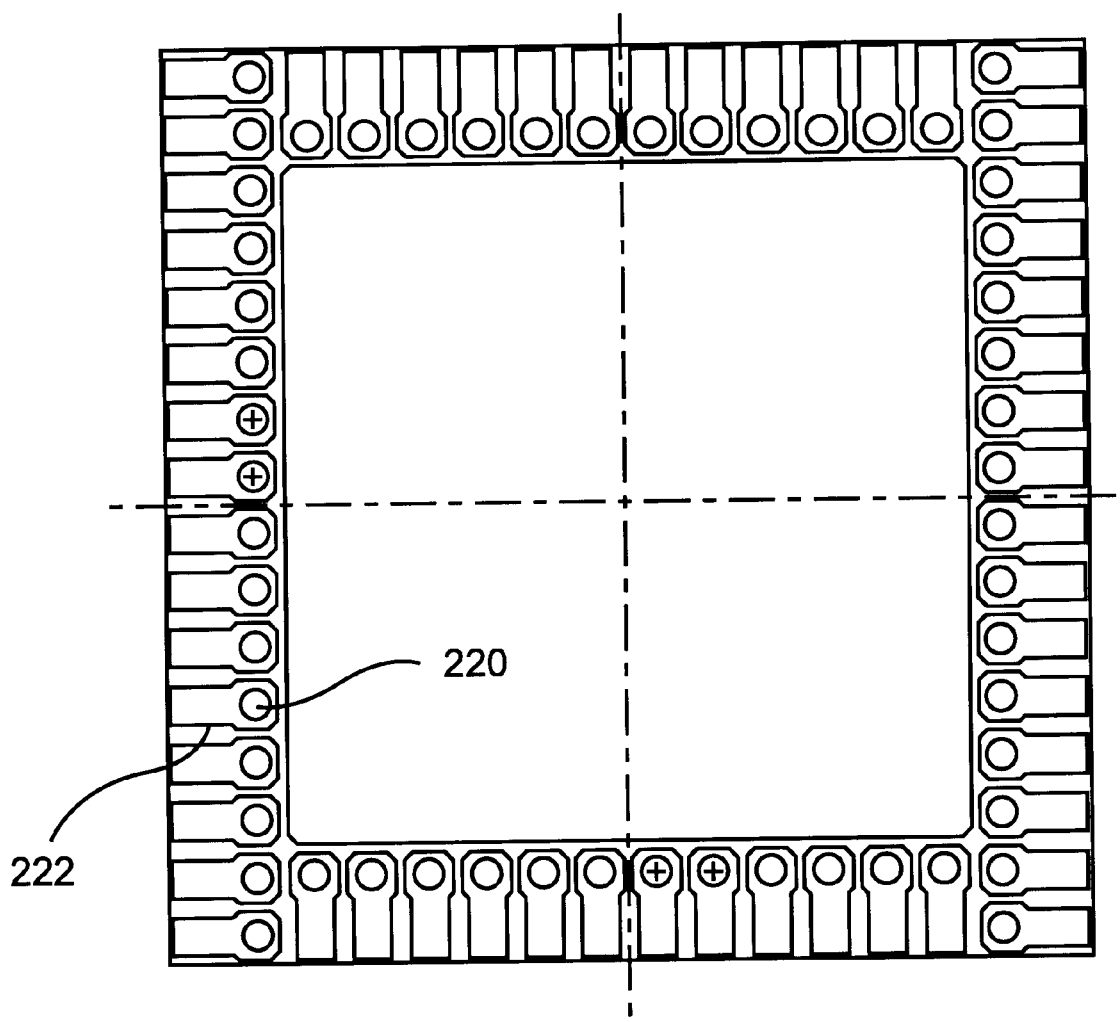
FIG. 3(b) is a diagrammatic bottom view of the substrate segment of FIG. 3(a).

Referring next to FIGS. 3(a) and 3(b), a representative substrate segment in accordance with one aspect of the invention will be described. As seen therein, the substrate segment 210 includes a plurality of metal landings (bond pads) 215 arranged in a rectangular row about a die attach area 217. Each landing 215 has a wire bonding pad region 219 suitable for use in wire bonding and a via 220 that extends directly through the substrate. The vias 220 open directly into contact pads 222 formed on the bottom surface of the substrate segment as best illustrate in FIG. 3(b). These contact pads serve as electrical contacts to external devices. Thus, it should be appreciated that the substrate segment has a rectangular row of contact pads 222 located directly opposite the landings 215.

With the described arrangement the need for carefully laid out traces connecting the wire bond pads to the vias one side of a substrate and the vias to the external contact pads or balls on the other side of the substrate has been eliminated. The described structure has several other advantages also. For example, since the traces have been eliminated, the described structure has less capacitance problems and is potentially faster than standard grid array substrates since the conductive paths between the bond pads and the contact pads has been effectively minimized.

The actual shape of the metalization used to form the contact pads 222 and landings 215 may be varied relatively extensively to meet the needs of a particular application. The relatively rectangular geometry (such as illustrated for the landings 215 in FIG. 3(a)) and the somewhat tab key shape (as illustrated for the contact pads 222 in FIG. 3(b)) work quite well. The reason is that since the pads are relatively narrow, they can be placed quite close to one another which permits the construction of relatively fine pitch devices that have relatively high pin counts. At the same time, the contact pads 222 have a large enough overall size to form good contacts suitable for coupling to a printed circuit board or the like. It is noted that in the embodiments shown, the wire bonding pad portions 219 of landings 215 are adjacent the vias 220. The reason for this is that in the applicant's experience, wire bonding directly to the vias does not create good quality, reliable bonds. However, it is contemplated that in the future, better techniques may be developed that facilitate direct wire bonding to the vias. In such a circumstance, the size of the landings 215 may be even further reduced.

During packaging, a die is mounted on the die attach area on the top surface of the substrate using conventional techniques. I/O pads (not shown) on the die are then electrically connected to associated landings 215 using a conventional technique such as wire bonding. As will be described in more detail below, preferably, the wire bonding is done using non-stick detection. After the die has been wire bonded or otherwise electrically connected to the substrate, a plastic material can be used to encapsulate the die and bonding wires. Since the substrate segments are part of a substrate strip, all of these packaging steps can be done on a strip or panel level. That is, the dice are attached to the substrate strip and the wire bonding and encapsulating steps are all done while the dice are mounted to the substrate strip.

Figure 5:
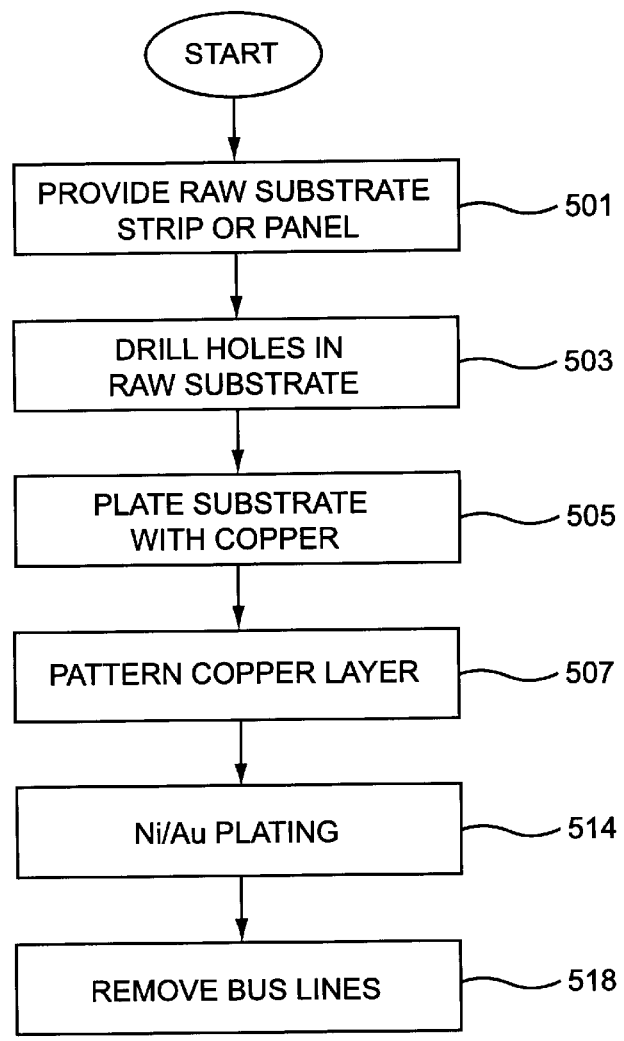
FIG. 5 is a flow chart illustrating a method of forming a substrate suitable for use in strip level testing in accordance with one embodiment of the present invention.

To further improve the efficiency of the packaging process, it would be advantageous to also test the packaged integrated circuit devices at the strip level rather than having to singulate the devices before testing. However, this is not a simple undertaking. The reason is that (as will be described in more detail below), it is desirable to gold plate the metalization on the substrate strip to provide a good adhesion surface for wire bonding. There are generally two types of gold plating that are commonly used. That is, electroless plating and electrolytic plating. Of the two, electrolytic plating is somewhat preferable since it facilitates more reliable wire bonds. However, one drawback of the electrolytic plating process is that it typically requires grounding of the surface being plated. To facilitate grounding, during the substrate fabrication process, buss lines are formed in the substrate that are electrically connected to each of the landings 215 and contact pads 222 that are to be gold plated. In conventional processing, the analogous buss lines would be cut away during the trimming process and the packaged integrated circuits would be tested in a singulated form after the trimming step. To facilitate strip testing of the packaged integrated circuit devices, the substrate fabrication process is modified to remove the buss line connections as discussed in more detail below with respect to FIG. 5. With this arrangement, the packaged integrated circuits can be tested in batches while they are still attached to the substrate strips.

Figure 4A:
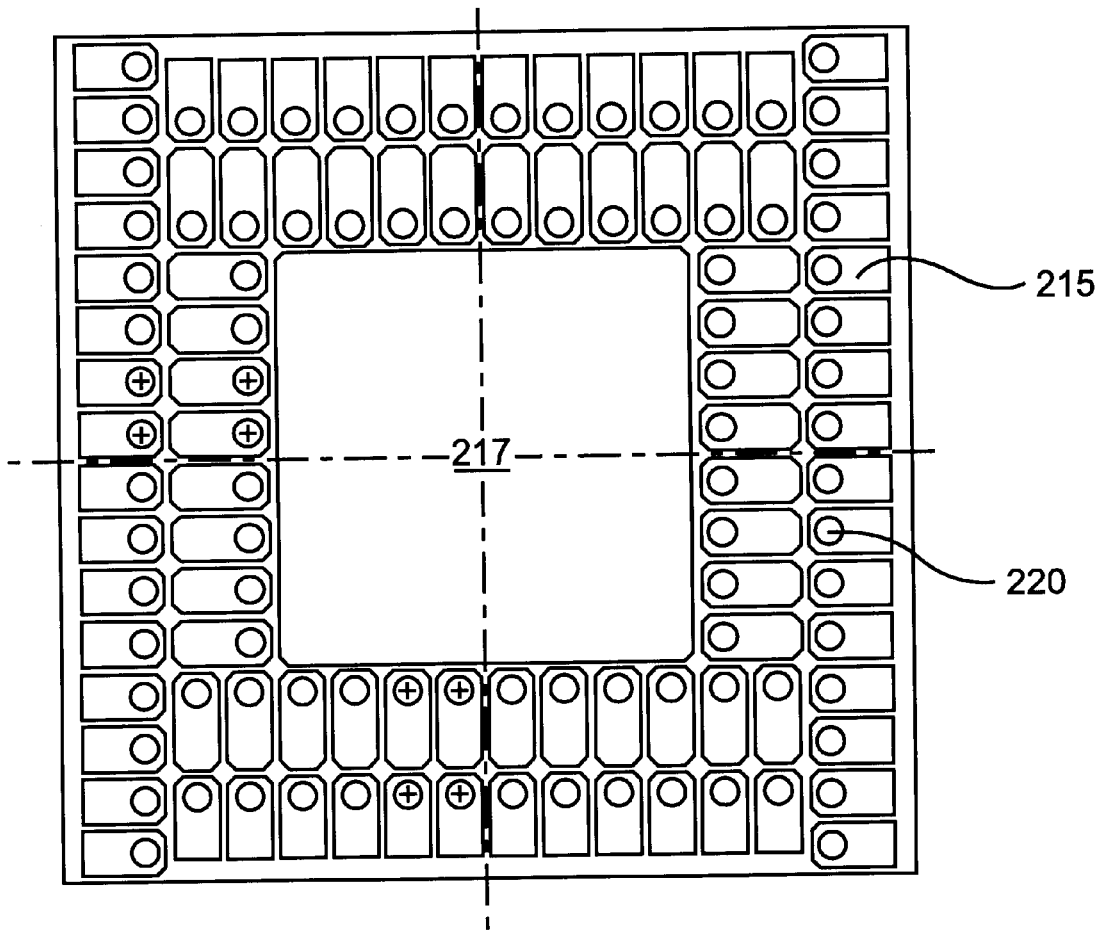
FIG. 4(a) is a diagrammatic top view of a duel row substrate segment in accordance with another embodiment of the invention.
Figure 4B:
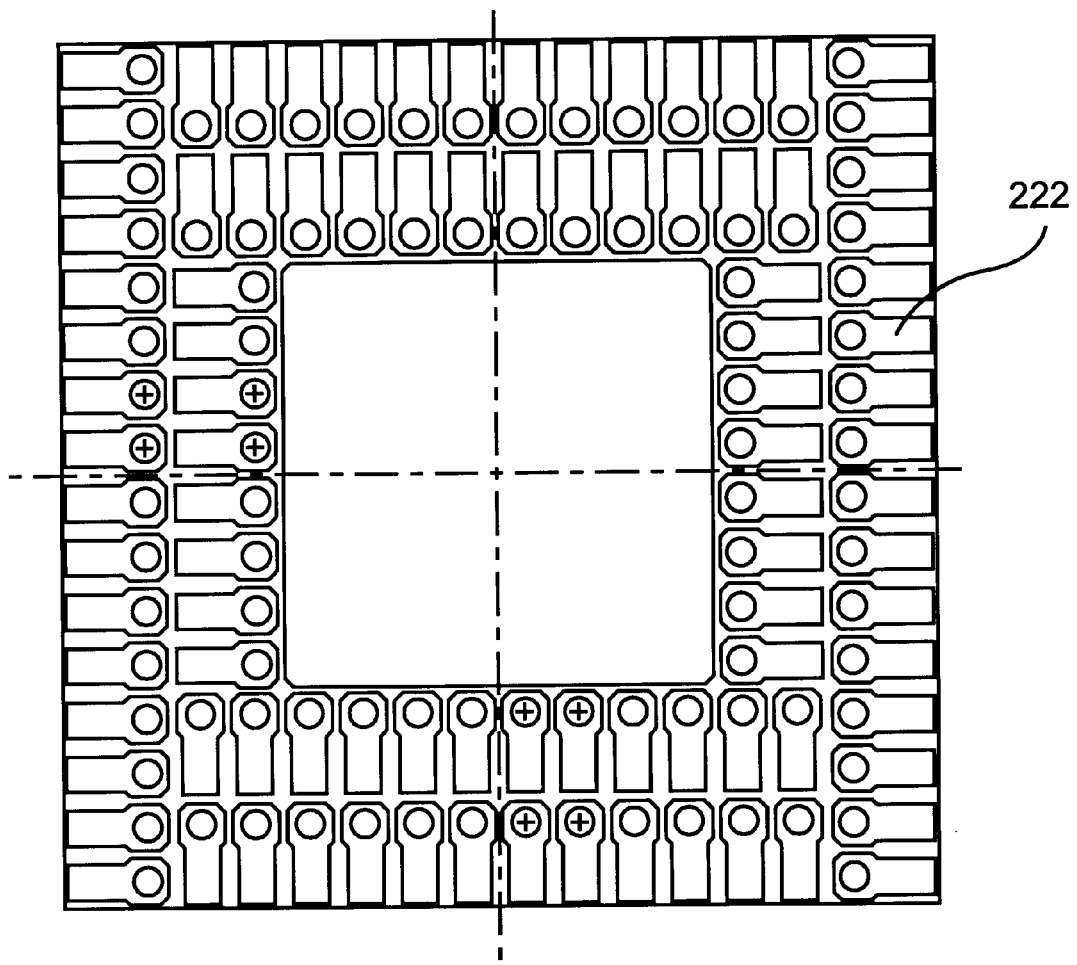
FIG. 4(b) is a diagrammatic bottom view of the substrate segment of FIG. 4(a).

Referring next to FIGS. 4(a) and 4(b) another substrate segment embodiment will be briefly described. In this embodiment, two rectangular rows of landings 215 and contact pads 222 are provided. The landings, contact pads and vias may all be formed in a manner similar to the structures described above with respect to FIGS. 3(a) and 3(b). During the wire bonding step, bond pads on the die are wire bonded to the appropriate associated landings 215. Depending upon the pitch of the landings/contact pads, in some situations, it may be difficult to wire bond to some of the corner landings. In such a situation, the corner landings/contact pads may be eliminated. As with the previously described embodiment, the number of landings/contact pads on each substrate segment may be widely varied in accordance with the needs of a particular application. By way of example, in the embodiment shown, the inner row has a total of 40 pads and the outer row has a total of 56 pads thereby providing a package with a total of 96 contact pads.

Substrate Formation

A wide variety of materials may be used to form the substrate. By way of example, BT (Bismaleimide Triazine Resin), FR4, FR5, flex substrates (polyimides), ceramic or other materials may be used. In the described embodiment BT is used as the substrate material. One process for forming the substrate will be described generally with reference to FIG. 5. A raw panel of BT (or other) substrate material is initially provided (step 501). Via holes are then drilled in the substrate at appropriate locations in step 503. As described above, the via holes are preferably drilled in rectangular rows that define the desired landings and contact pads. After the holes have been drilled, both the top and bottom surfaces of the substrate material are coated with a copper plating in step 505. A variety of conventional techniques can be used to form the copper plating. In the described embodiment, a two step plating procedure is utilized wherein an electroless copper plating technique is used first to apply a thin copper coating to the substrate and an electrolytic plating technique is used thereafter to build the thickness of the copper plating. It should be appreciated that since the holes are drilled in the substrate prior to the copper plating, the copper is deposited on the walls of the vias as well as the substrate surfaces, thereby electrically connecting the top and bottom platings.

After the substrate has been plated, the plated surface is patterned 507 to form the desired substrate metalization features. By way of example, when forming a substrate panel having a plurality of substrate strips having tiles with substrate segments 210 as illustrated in FIG. 3(a), the patterning of the top surface of the substrate will create the landings 215 and die attach pads in the die attach areas 217. The patterning on the bottom surface of the substrate will create the contact pads 222. The metalization layers can be patterned using any suitable technique including photoresist masking and etching.

As is well known to those skilled in the art, it is generally desirable to plate the copper metalization with gold (or other appropriate additional metalization) to improve the adhesion of the bonding wires to the landings 215. Typically, when gold plating the copper, it is also desirable to include a barrier layer (as for example a Nickel or Nickel alloy barrier layer) to improve the adhesion between the gold and copper layers. As previously mentioned, there are two common techniques for applying these further metalization layers (e.g. nickel and gold). That is, electroless plating and electrolytic plating.

Figure 6:
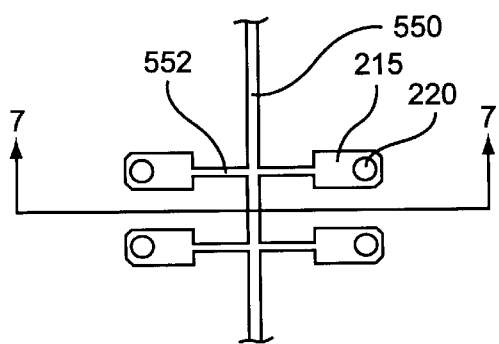
FIG. 6 is a diagrammatic view of a segment of a buss line coupling landing from two adjacent substrate segments.

In the described embodiment, electrolytic plating is generally preferred. However, to facilitate the electrolytic nickel/gold plating it is desirable to electrically ground the surface being plated. To facilitate this, the patterning 507 also defines buss lines (and/or any other appropriate connecting lines) on one or both of the substrate surfaces to electrically couple the various features to be gold plated. By way of example, one such arrangement is diagrammatically illustrated in FIG. 6. As seen therein, the buss line 550 electrically interconnects landings 215 on adjacent substrate segments. The buss lines, in turn, connect to a contact feature that can serve as an electrical contact. By way of example, the molding gate 572 works well as the contact feature. With the buss lines in place, the landings and contact pads may be electrically grounded as desired for the electrolytic nickel and/or gold plating steps.

After the copper layer has been patterned, the nickel and gold plating is done in step 514. In alternative embodiments other barrier layers and/or surface layers may be used and/or the barrier layer may be eliminated if appropriate. As pointed about above, in the preferred embodiment, electrolytic plating is used (which requires the grounding of the surfaces being plated). In some alternative embodiments, electroless plating may be used. In such embodiments, the described buss lines may be eliminated.

After the plating has been done, the buss lines are removed in step 518 and thereafter, the remainder of the substrate processing is completed. To facilitate non-stick detection, one or more of the pins (preferably ground pin(s)) is left electrically connected to the contact feature (e.g. mold gate 572). Thus, in the described embodiment, during the buss line removal, the buss lines and/or interconnect features that are used only to facilitate electrolytic plating are removed. Features that are needed later in the processing (e.g. the interconnect features for non-stick detection) may be preserved. The non-stick protection interconnects preferably connect to one or more of the ground pins. With this arrangement, the electrical connection does not interfere with subsequent strip testing of the integrated circuits.

Figure 7:
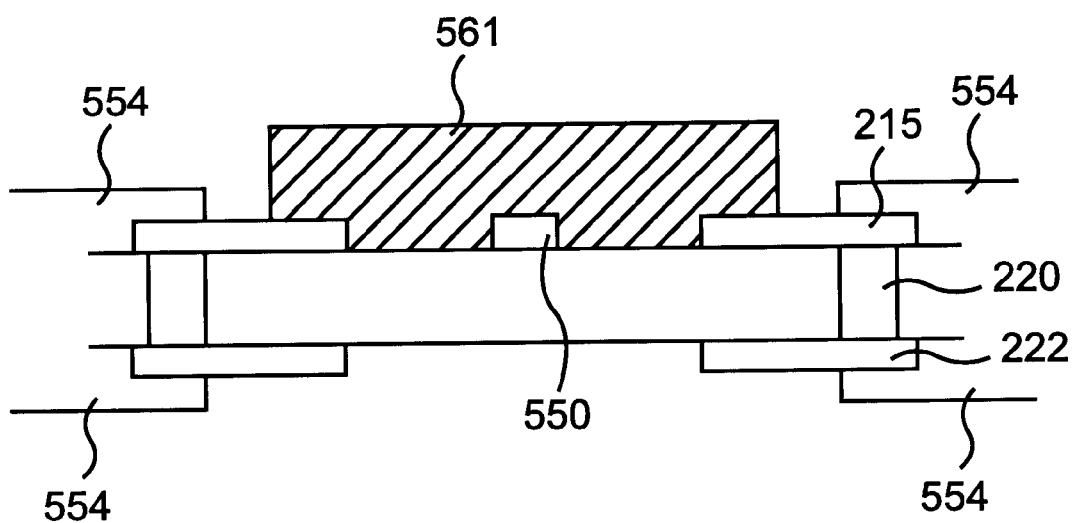
FIG. 7 is a diagrammatic cross sectional side view illustrating a sacrificial mask over the buss line.

To facilitate removal of the buss lines, a wide variety of processes may be used, and the appropriate process for a particular situation will be highly dependent upon the specific substrate formation process. By way of example, in some processes, a chemical etch back may be used to remove the buss lines after the electrolytic plating. In some embodiments as illustrated in FIG. 7, a sacrificial mask 561 may be used to protect the buss lines and interconnects at appropriate stages. The sacrificial masks may then be removed to permit etching of the buss lines. In other processes, all or some of the copper features to be kept may be gold plated. The copper buss lines and/or interconnect features to be removed can be etched away using conventional copper etchants that do not attack gold. In this approach, the gold prevents damage to the bond pads 216 and contact pads 222 during the copper etch. Thus, it should be apparent that the actual process used to remove the buss lines may be widely varied and it should be appreciated that optimization of the process may result in quite different ordering of the various steps.

Figure 8:
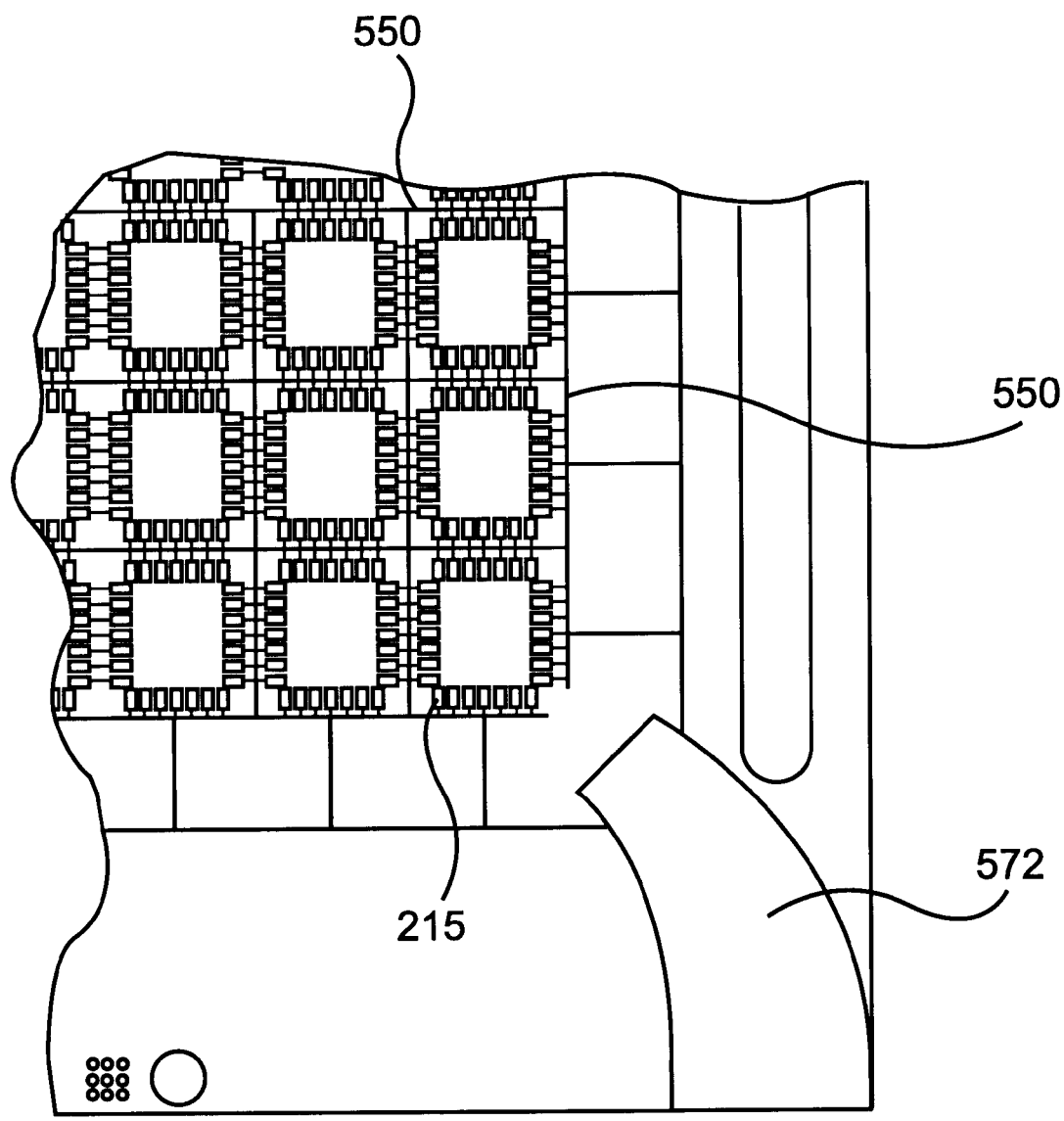
FIG. 8 is a diagrammatic illustration of the buss lines structure associated with a particular embodiment of the invention.

One feature or aspect that has not been described in any detail is the connection of the buss lines to the various landings/contact pads. Each tile 207 has a matrix of buss lines 550 that run along "streets" between each adjacent row and column of substrate segments 210 as best seen in FIG. 8. Buss lines are also provided about the peripheral substrate segments. In the substrate array embodiment of FIG. 3(a), the buss lines 550 are simply connected to the landings by short runners 552. Since the contact pads 222 are electrically connected to the landings 215 through vias 220, good electrical connection is made to the contact pads 222 as well. This arrangement works very well for substrate segments having a single row of landings/contact pads such as the embodiment illustrated in FIG. 3(a). The buss lines on a particular tiles are then electrically connected to the mold gate 572 (or other appropriate contact feature) to facilitate grounding of the contact pads and landings during gold plating. In the described embodiment, the buss lines are on the top surface of the substrate (i.e. the surface that has the die attach area). However, it should be apparent that in alternative embodiments, the buss lines could be provided on the bottom substrate surface (thereby connecting the contact pads) or on both the top and bottom surfaces.

Figure 9:
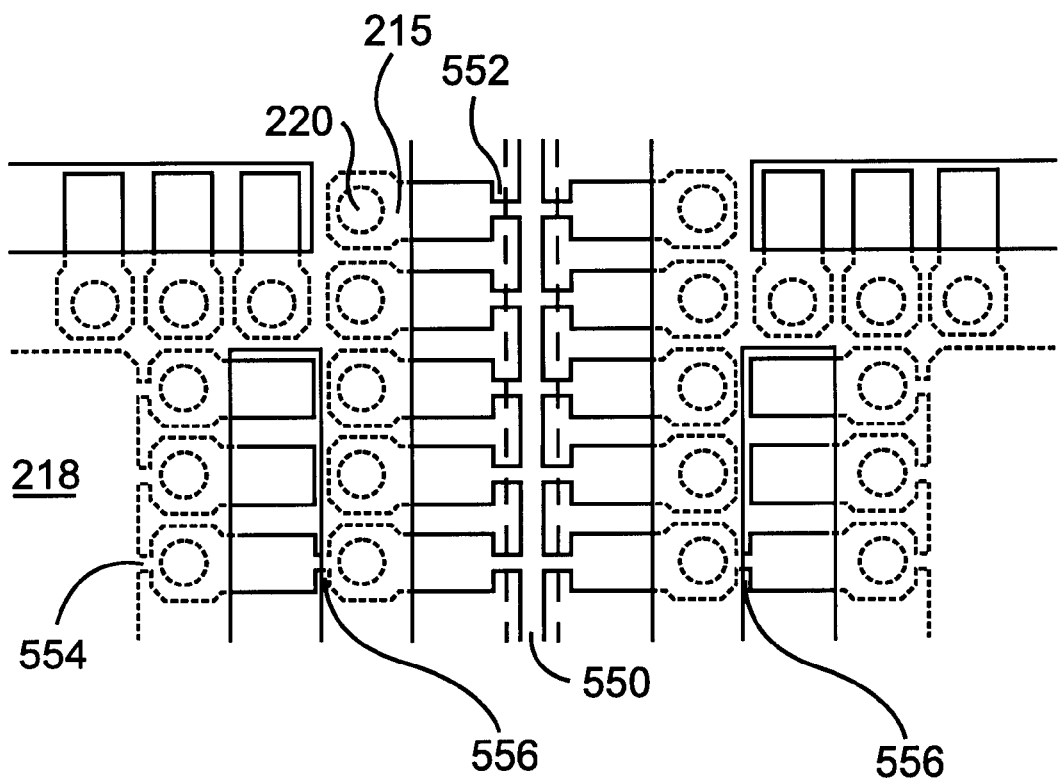
FIG. 9 is a diagrammatic top view of the duel row substrate segment of FIG. 4(a) highlighting the electrical connection of the buss lines and die attach pad during gold plating.

In embodiments having two rows of landings/contact pads such as the embodiment illustrated in FIG. 4(a), a slightly more complicated interconnection scheme is required. One suitable arrangement is diagrammatically illustrated in the embodiment shown in FIG. 9. As previously mentioned, each tile 207 has a matrix of buss lines 550 that run along "streets" between each adjacent row and column of substrate segments 210 as well as about the peripheral substrate segments. The outer row of landings are connected to the buss lines by short runners 552. The inner row of landings are connected to the metalized die attach pad 218 by short runners 554. In embodiments where the die attach pad is not metalized, a buss line within the die attach area works well in place of the metalized die attach pad.

With this arrangement, all that needs to be done is to electrically connect the die attach pad 218 to an appropriate buss line 550. This can be accomplished in a number of ways. As will be appreciated by those skilled in the art, high pin count integrated circuits typically have a large number of their pins designated as ground or power pins. In the illustrated embodiment, the pin layout is designed such that two of the ground pins (or alternatively two of the power pins) are adjacent each other in the inner and outer rows respectively. With this arrangement, one or more inter-row runners 556 can be provided which electrically couple an inner row ground pin to an outer row ground pin. This completes the electrical connection between the buss lines 550 and the die attach pad 218 for the gold plating. In this embodiment it is often not critical that the inter-row runner be removed. Indeed, to facilitate non-stick detection during wire bonding, it may be desirable to retain the connection for the reasons described above. Of course, in more general embodiments, the majority of the inter-row runners 556, as well as the inner row runners 554 and/or an inner buss line are sacrificial structures that may be removed in a manner similar to the removal of the buss lines as described above with reference to FIG. 5. As pointed out above, the various interconnect, buss line and contact features may be provided on the top, the bottom or both surfaces of the substrate.

Strip Testing

As will be appreciated by those skilled in the art, substrate fabrication is typically done quite separately from packaging and for many types of substrates (e.g. BT), there are only a small handful of companies that have commercially available technologies for fabricating substrates. Once the appropriate substrate has been obtained, dice may be mounted to the substrate in either panel or strip form using conventional die attach techniques. The dice are then electrically connected to the substrate using conventional technique such as wire bonding. As previously described, when wire bonding is used, it is preferable to use a non-stick detection type wire bonding. Typically, the wire bonding machine has a probe which contacts the mold gate 572 during wire bonding to facilitate the non-stick detection.

After the wire bonding, an encapsulant such as a plastic material is used to cover and protect the dice. A wide variety of conventional encapsulating techniques that are well know in the industry may be used for the encapsulation. As will be appreciated by those skilled in the art, transfer molding is most commonly used, although injection molding, glob topping or other techniques may be used in the alternative. During the encapsulation each molding area or tile 207 (which has a plurality of dice mounted thereon) is typically encapsulated as a unit.

After the encapsulation, the dice are tested in strip format. Depending on the tester being used, any appropriate number and grouping of dice may be tested simultaneously. By way of example, all of the dice on a particular tile may be tested simultaneously and/or all of the tiles may be tested simultaneously. In still other embodiments, multiple strips in a panel may be tested simultaneously. Of course, the groupings may be varied as well, with partial tiles being tested at the same time and/or dice from different tiles being simultaneously tested. The advantage of the described arrangement is that there is no need to singulate the devices before testing. As the density of devices on a substrate strip or panel increases, the ability to strip test the devices becomes more and more important. Indeed, it should be appreciated that even when only a single die is tested at a time, the described arrangement still has significant advantages over testing singulated dice since substantially less handling is required. Adding the ability to test a number of devices simultaneously offers the potential of dramatically reducing the amount of time required to test packaged devices.

Although only a few aspects and embodiments of the present invention have been described, it should be understood that the present invention may be embodied in many other specific forms without departing from the spirit or scope of the invention. For example, the geometry and layout of the landings and bond pads may be widely varied. Also, the number of contacts per row as well as the number of contact rows may be widely varied to meet the needs of a particular integrated circuit. For example in low pin count packaging, as few as four, six or eight contacts may be appropriate. In higher pin count packaging, it may be desirable to provide three or potentially even more rows of contacts. The rows have been described as being rectangular about the die attach area. Although such an arrangement is typically optimal from a space layout standpoint, for specific applications it may be desirable to use other row based layouts.

The substrate formation aspects of the invention have been described primarily in the context of a BT substrate having gold plated copper metalization. However, the described substrate formation techniques can be employed in the fabrication of a wide variety of different substrates for semiconductor packaging. In some embodiments, sacrificial buss lines may be employed. In others, the buss lines can simply be electrically severed without requiring their complete removal. Further, the further metalization can be done using a number of different processes which one way or another completely eliminate the need to employ buss lines. Therefore, the present examples are to be considered as illustrative and not restrictive, and the invention is not to be limited to the details given herein, but may be modified within the scope of the appended claims.

What is claimed is:

1. A method of fabricating a substrate strip having a plurality of substrate segments suitable for use in semiconductor packaging formed thereon, each substrate segment having a die attach area and a plurality of landings located on a top surface and a plurality of contact pads on a bottom surface, the landings and contact pads being electrically coupled by at least conductive vias that pass through the substrate segment, the method comprising:

forming a plurality of holes in the substrate strip;

plating a first metalization layer on the substrate thereby plating or filling the holes with a conductive material to form electrically conductive vias;

patterning the first metalization layer to form a multiplicity of landings on a first surface of the substrate, a multiplicity of contact pads on a second surface of the substrate, and buss lines and/or interconnection features that electrically couple the landings;

plating portions of the landings with one or more further metallic layers wherein the landings are electrically charged or grounded during at least a portion of the plating of the further metallic layers; and severing the electrical connection between a plurality of the landings after the further metallic layer plating by removing at least a portion of the buss lines and/or interconnection features, without separating the substrate segments.

2. A method as recited in claim 1 wherein the patterning on the top surface further forms a molding gate metalization, wherein the buss lines and/or interconnection features electrically couple the landings to the molding gate metalization.

3. A method as recited in claim 2 wherein the plating of the one or more further metallic layers is an electrolytic plating.

4. A method as recited in claim 1 wherein gold is used to plate the landing portions.

5. A method as recited in claim 1 wherein the further metallic layers include a gold layer and a nickel based layer.

6. A method of packaging integrated circuits comprising the steps of:

fabricating a substrate as recited in claim 1;

mounting a plurality of dice on a substrate strip, each die being mounted to an associated die attach area on the substrate strip;

electrically connecting bond pads on the dice to associated landings on the substrate using bonding wires, using non-stick detection wire bonding.

7. A method as recited in claim 6 further comprising the steps of:

encapsulating the dice and bonding wires with an encapsulating material; and electrically testing the encapsulated dice in strip format.

8. A method as recited in claim 1 wherein the landings for each substrate segment take the form of bond fingers that are arranged rectilinearly about the die attach area and the associated contact pads are arranged in a matching rectilinear arrangement on the bottom surface of the substrate with the conductive vias being arranged to pass directly through the substrate from the bond fingers to the contact pads.

9. A method packaging integrated circuits comprising the steps of:

mounting a plurality of dice on a substrate strip, the substrate strip having a plurality of discrete molding area tiles and each tile having an array of substrate segments suitable for use in semiconductor packaging formed thereon, each substrate segment having a die attach area and a plurality of landings located on a top surface and a plurality of contact pads on a bottom surface;

electrically connecting bond pads on the dice to associated landings on the substrate using bonding wires;

encapsulating the dice and bonding wires with an encapsulant material;

electrically testing the encapsulated dice in strip format.

10. A method as recited in claim 9 wherein non-stick detection wiring bonding is used to electrically connect the bond pads of the dice to their associated landings.

11. A method as recited in claim 9 further comprising the step of singulating the electrically tested, packaged integrated circuits.

12. A method of testing integrated circuits on a substrate panel having a plurality of distinct molding tiles, each tile having a two dimensional array of substrate segments suitable for use in semiconductor packaging formed thereon, the method comprising:

attaching a plurality of dice to the substrate panel; and electronically testing the dice in panel form.

13. A substrate strip for use in integrated circuit packaging, the substrate strip having a plurality of distinct molding area tiles, each tile having a two dimensional array of substrate segments formed thereon, each substrate segment having:

a die attach area suitable for supporting an associated die on a first surface of the substrate segment;

a plurality of landings formed on the first surface of the substrate segment outside of the die attach area, the landings having bond pads suitable for use in wire bonding and being arranged in at least one row that extends adjacent or around the die attach area;

a plurality of contact pads formed on a second surface of the substrate segment substantially across from the landings; and a plurality of conductive vias that each directly couple an associated one of the landings to an associated one of the contact pads such that extended routing traces are not required to electrically couple the bond pads to the contact pads.

14. A substrate strip as recited in claim 13 wherein the landings are arranged in at least two rows about or adjacent the die attach area including an inner row and an outer row.

15. A substrate strip as recited in claim 14 wherein:

the landings in the outer row are electrically coupled to a buss line;

the landings in the inner row are electrically coupled to a die attach pad located in the die attach area; and at least one of the landings in the inner row is directly electrically coupled to an adjacent bond pad in the outer row.

16. A substrate strip as recited in claim 13 wherein all of the contacts pads on each substrate segment are directly electrically coupled to associated landings through associated vias and no routing traces are used to assist in the electrical connection of any of the contact pads to their associated bond pads.

17. A substrate panel having a plurality of adjacent substrate strips as recited in claim 13.

18. A method of packaging integrated circuits comprising:

fabricating a substrate strip having a plurality of substrate segments suitable for use in semiconductor packaging formed thereon, each substrate segment having a die attach area and at least one rectilinear arrangement of bond fingers located on a top surface and a matching rectilinear arrangement of contact pads on a bottom surface, the bond fingers and contact pads being electrically coupled by conductive vias that pass directly through the substrate segment from the bond fingers to the contact pads, the method comprising:

forming a plurality of holes in the substrate strip;

plating copper on the substrate thereby plating or filling the holes with a conductive material to form electrically conductive vias;

patterning the copper to form the bond fingers, the contact pads and buss lines and/or interconnection features that electrically couple the bond fingers or contact pads, wherein the patterned bond fingers are coupled to associated contacts pads by associated vias;

plating at least segments of the bond fingers with nickel and gold layers using an electrolytic plating process; and severing the electrical connection between a plurality of the bond fingers after the nickel and gold plating by removing at least a portion of the buss lines and/or interconnection features, without separating the substrate segments.

19. A method of packaging integrated circuits comprising the steps of:

fabricating a substrate as recited in claim 18;

mounting a plurality of dice on a substrate strip, each die being mounted to an associated die attach area on the substrate strip;

electrically connecting bond pads on the dice to associated landings on the substrate using bonding wires, using non-stick detection wire bonding;

encapsulating the dice and bonding wires with an encapsulating material, wherein the substrate strip is effectively divided into a plurality of molding areas and each molding area has a plurality of dice located therein; and electrically testing the encapsulated dice in strip format.

* * * * *